United States Patent [19]

Lou et al.

[11] 4,164,031

[45] Aug. 7, 1979

[54] MEMORY SYSTEM

[75] Inventors: Perry W. Lou, Houston, Tex.;
Charles P. Grant, Jr., deceased, late
of Dallas, Tex., by Charles P. Grant,
administrator

[73] Assignee: Texas Instruments Incorporated,
Dallas, Tex.

[21] Appl. No.: 745,157

[22] Filed: Nov. 26, 1976

[51] Int. Cl.² .................... G11C 11/40; G11C 13/00
[52] U.S. Cl. ................................... 365/233; 365/193
[58] Field of Search ............... 340/173 R; 365/193,
365/222, 233, 238

[56] References Cited

U.S. PATENT DOCUMENTS

| | | | |
|---|---|---|---|
| 3,719,932 | 3/1973 | Cappon | 365/222 |
| 3,731,287 | 5/1973 | Seely et al. | 340/173 SM |
| 3,763,480 | 10/1973 | Wetmer | 340/173 SM |
| 3,893,088 | 7/1975 | Bell | 340/173 SM |
| 3,914,750 | 10/1975 | Hadden | 340/173 SM |
| 4,094,009 | 6/1978 | Schneider | 365/238 |

*Primary Examiner*—Terrell W. Fears
*Attorney, Agent, or Firm*—William K. McCord; Stephen S. Sadacca; Melvin Sharp

[57] ABSTRACT

Disclosed is a memory system for storing digital data; the memory system of the type which may be implemented, for instance, in an electronic microprocessor or calculator system. The memory comprises an array of transistor memory cells arranged in columns and rows. Column conductors are provided for supplying digital information to each column of such cells and row conductors are provided for enabling each row of cells to store digital information being received on the column conductors. A commutator is provided for successively supplying enabling signals to the row conductors and another commutator is provided for successfully connecting the column conductors with an input/output bus in the memory system. The provision of the commutators with the array of memory cells causes the data, when stored as a word of data, to occupy a register arranged in essentially a diagonal pattern through the array.

22 Claims, 7 Drawing Figures

MEMORY SYSTEM

BACKGROUND OF THE INVENTION

The present invention relates to a memory system of the type preferably implemented on a semiconductor chip with an electronic calculator or microprocessor system. More specifically, the invention relates to a novel scheme for inputting data to and outputting data from an array of transistor memory cells. The array of transistor memory cells are preferably implemented as a sequentially addressed memory (SAM) of the type disclosed in U.S. Pat. No. 3,893,088, "Random Access Memory Shift Register System" granted on July 1, 1975 to Anthony G. Bell and assigned to the assignee of this invention. In the prior art, it was known, to use a single commutator in a SAM and also to input or output words of numeric data to or from the registers by using a plurality of register selector gates. A plurality of control lines were used to enable the register selector gates interconnecting the register addressed with a data bus. It has been found that as the number of registers for storing numeric data increase, the number of control lines also increase; further, as the number of control lines increase, the semiconductor chip area required to implement the memory system increase at even a faster rate. Exemplary of a prior art memory system using a plurality of control lines to control the plurality of register selector gates is the SAM depicted in FIG. 8c in U.S. Pat. No. 3,924,110 "Calculator System Featuring a Subroutine Register" issued to Michael J. Cochran and Charles P. Grant, Jr. on Dec. 2, 1975 and assigned to the assignee of this invention. By using a second commutator, it has been found that the number of control lines is reduced, resulting in a net savings in silicon area.

It is therefore, one object of this invention to provide a memory system requiring less silicon area than memory systems known in the prior art. It is another object of this invention to provide a sequentially addressed memory system having two commutator systems for loading data into the memory and for reading data out of the memory.

The foregoing objects are achieved as is now described. In a preferred embodiment of the invention, an array of transistor memory cells comprising a sequentially addressed memory is implemented on a semiconductor chip. Two commutator systems are provided to access the array. A first commutator system is provided for supplying successive enabling signals to the row conductors in the sequentially addressed memory. A second commutator system is provided to successively connect the column conductors of the array with an input/output data bus. The second commutator system is preferably implemented as a shift register for controlling gates interconnecting the data bus with the column conductors of the array. In a further aspect, the first and second commutators are clocked at the same frequency; however, control means is provided to adjust the phase relationship between the first second commutators thereby providing a plurality of register storage locations within the array. A single register occupies essentially a diagonal pattern of the cells through the array. The control circuit is preferably responsive to an address indicating which one of the plurality registers implemented in the array is being addressed.

BRIEF DESCRIPTION OF THE DRAWINGS

The novel features believed characteristic of the invention are set forth in the appended claims. The invention itself, however, is as well as a preferred mode of use, further objects and advantage thereof, will be best understood by reference to the following detailed description of an illustrative embodiment when read in conjunction with the accompanying drawings wherein:

DETAILED DESCRIPTION OF A SPECIFIC EMBODIMENT

Figure 1:
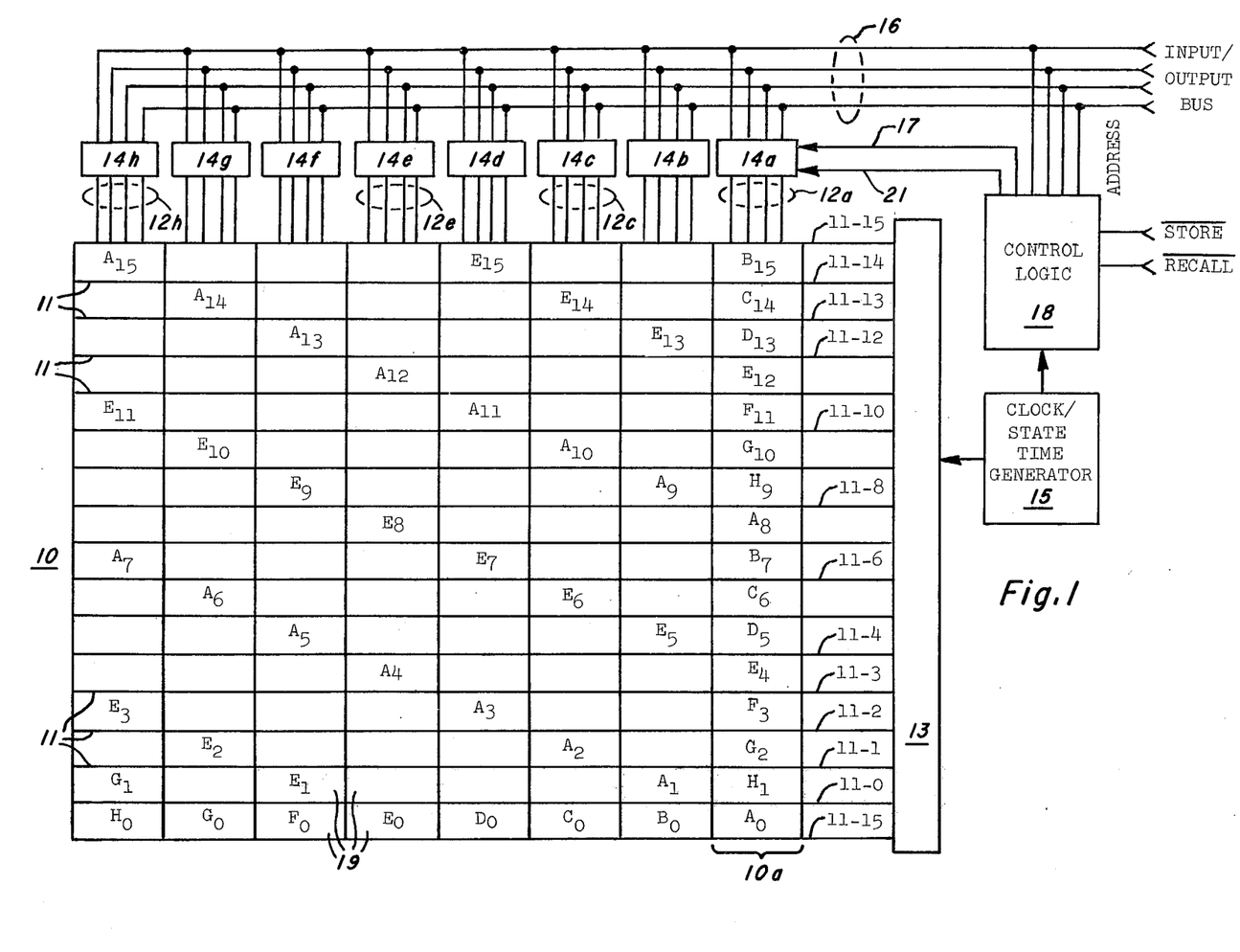
FIG. 1 is a functional block diagram of the memory system of this invention.
Figure 2A:
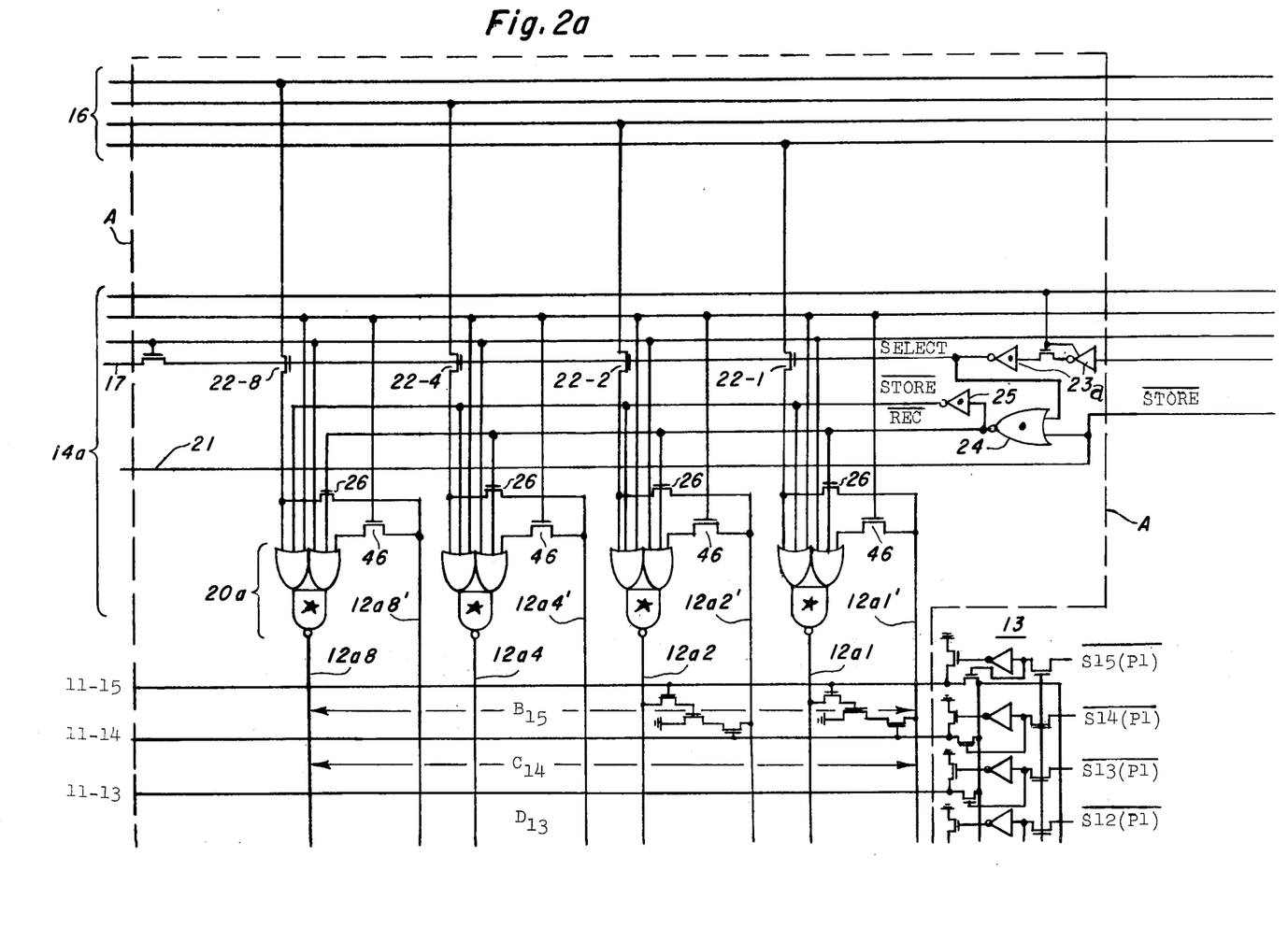
FIGS. 2a–2f form a composite drawing of a logic diagram of the memory system of this invention including addressing and control circuitry associated therewith.
Figure 2B:
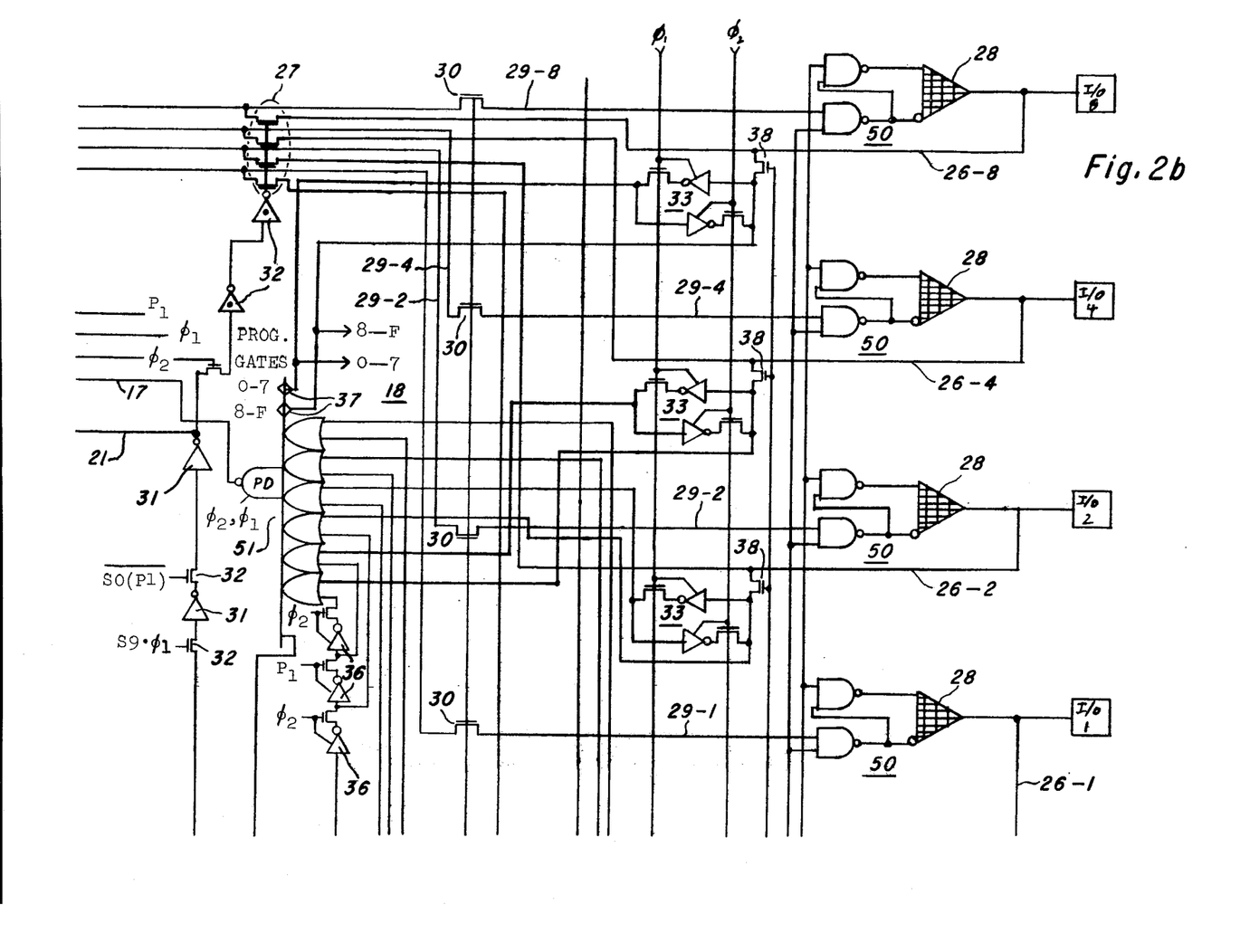
Figure 2C:
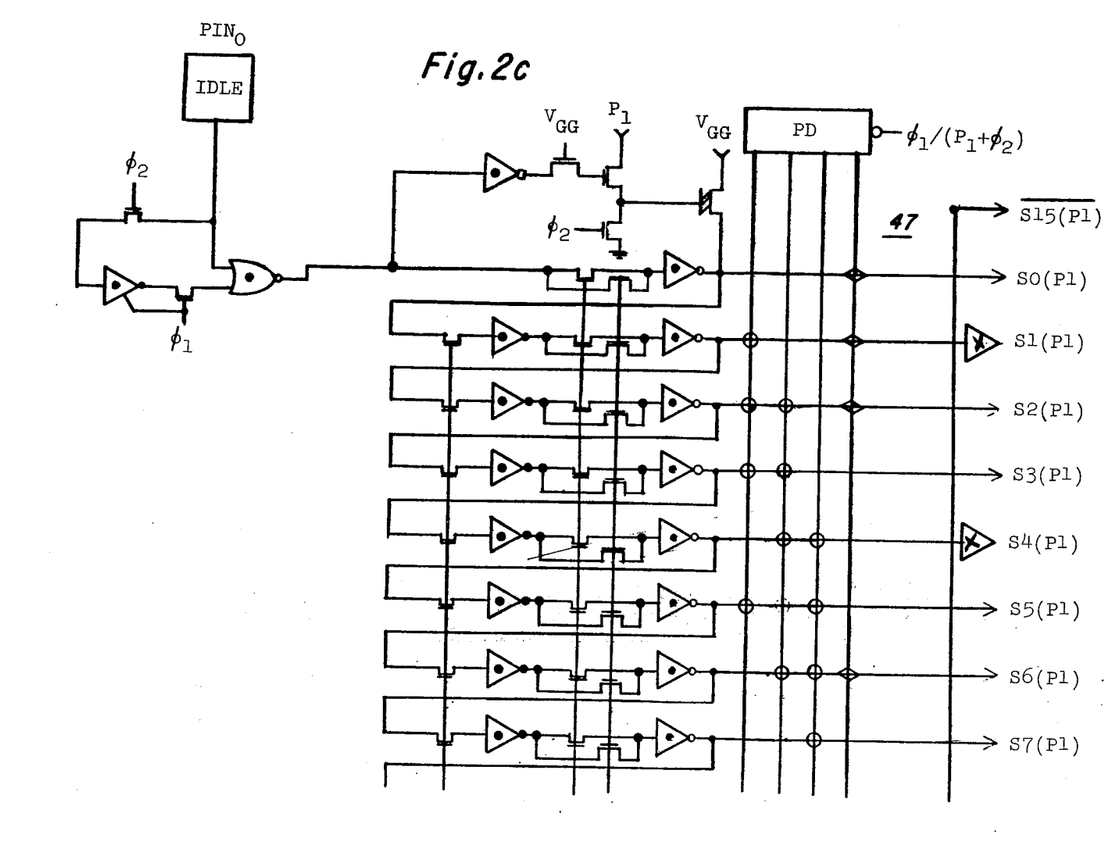
Figure 2D:
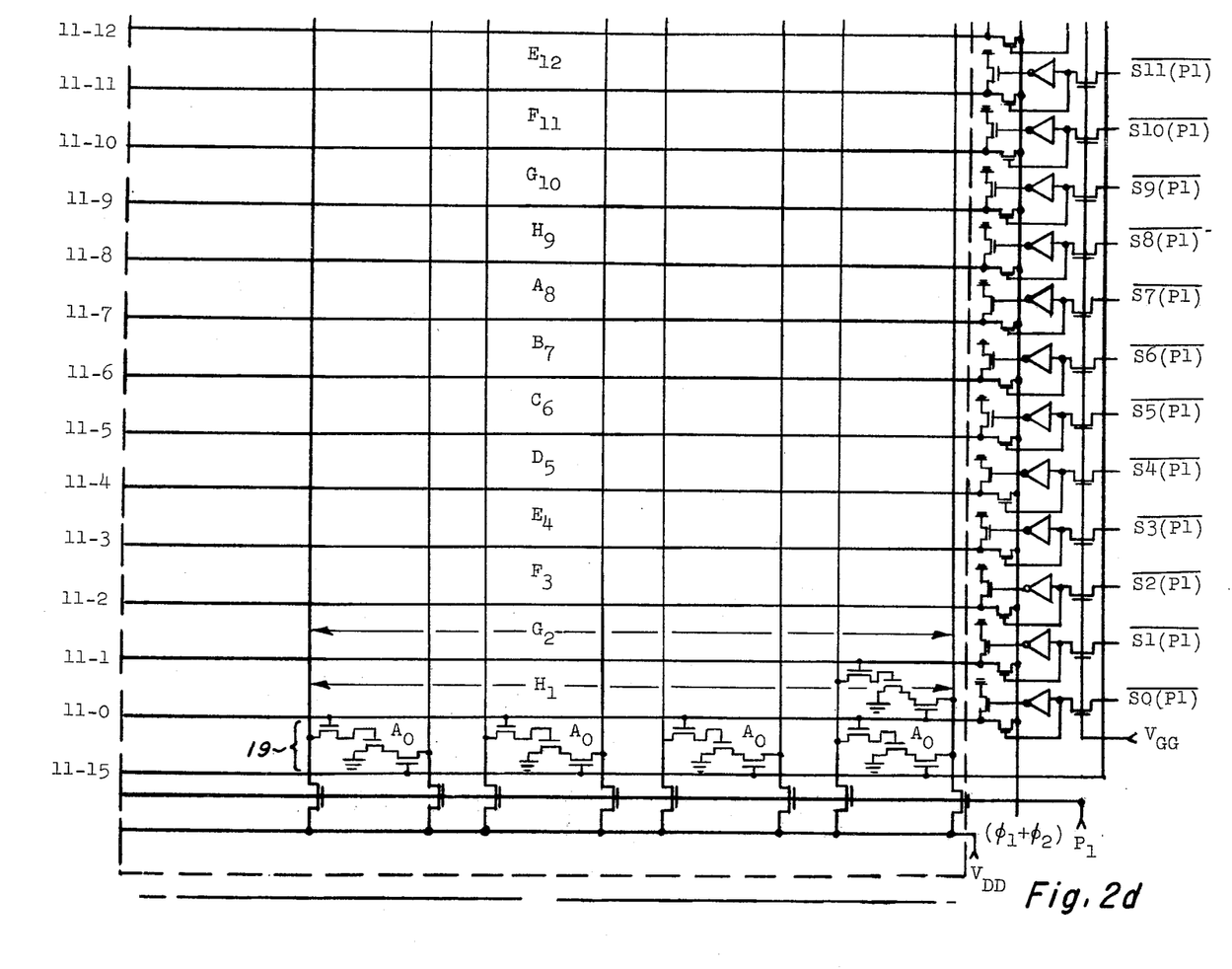
Figure 2E:
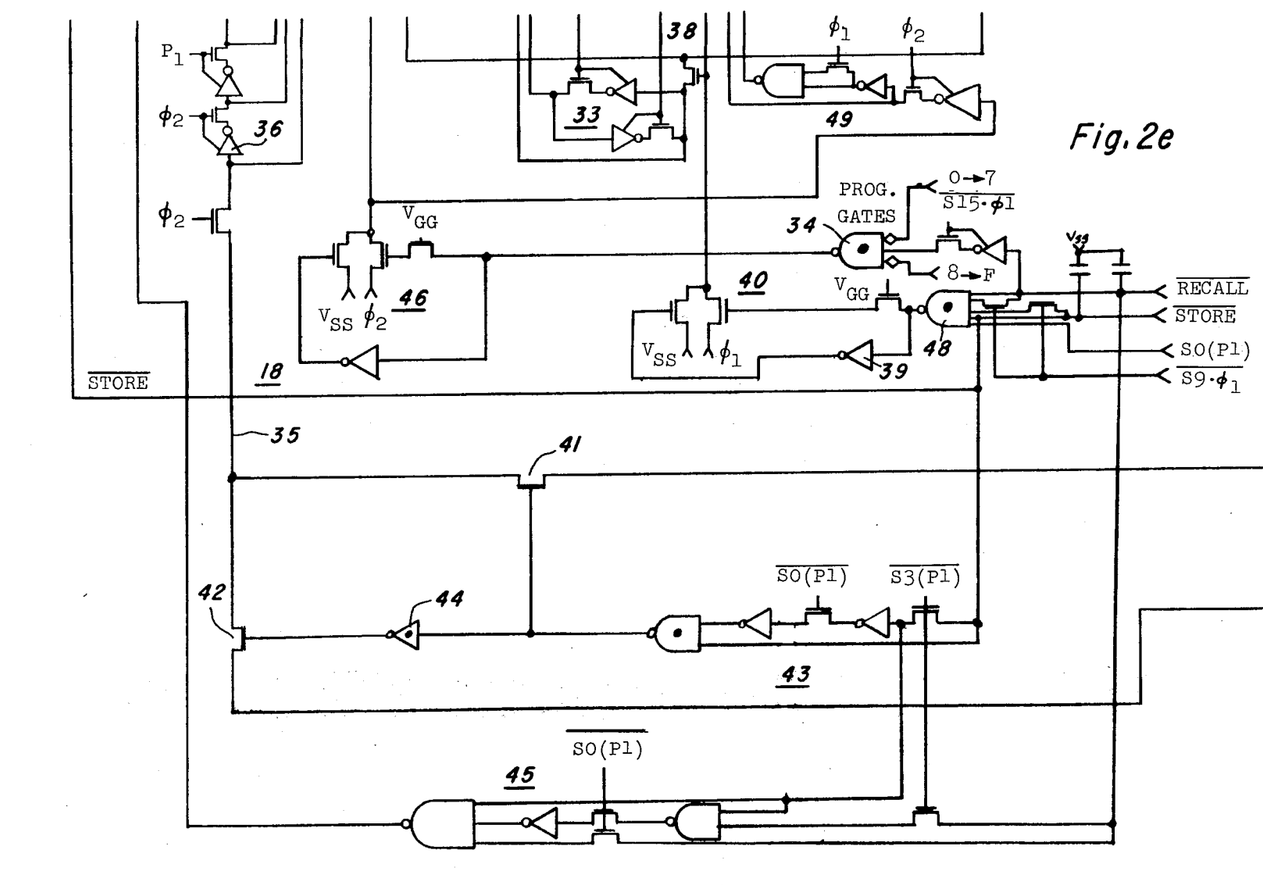
Figure 2F:
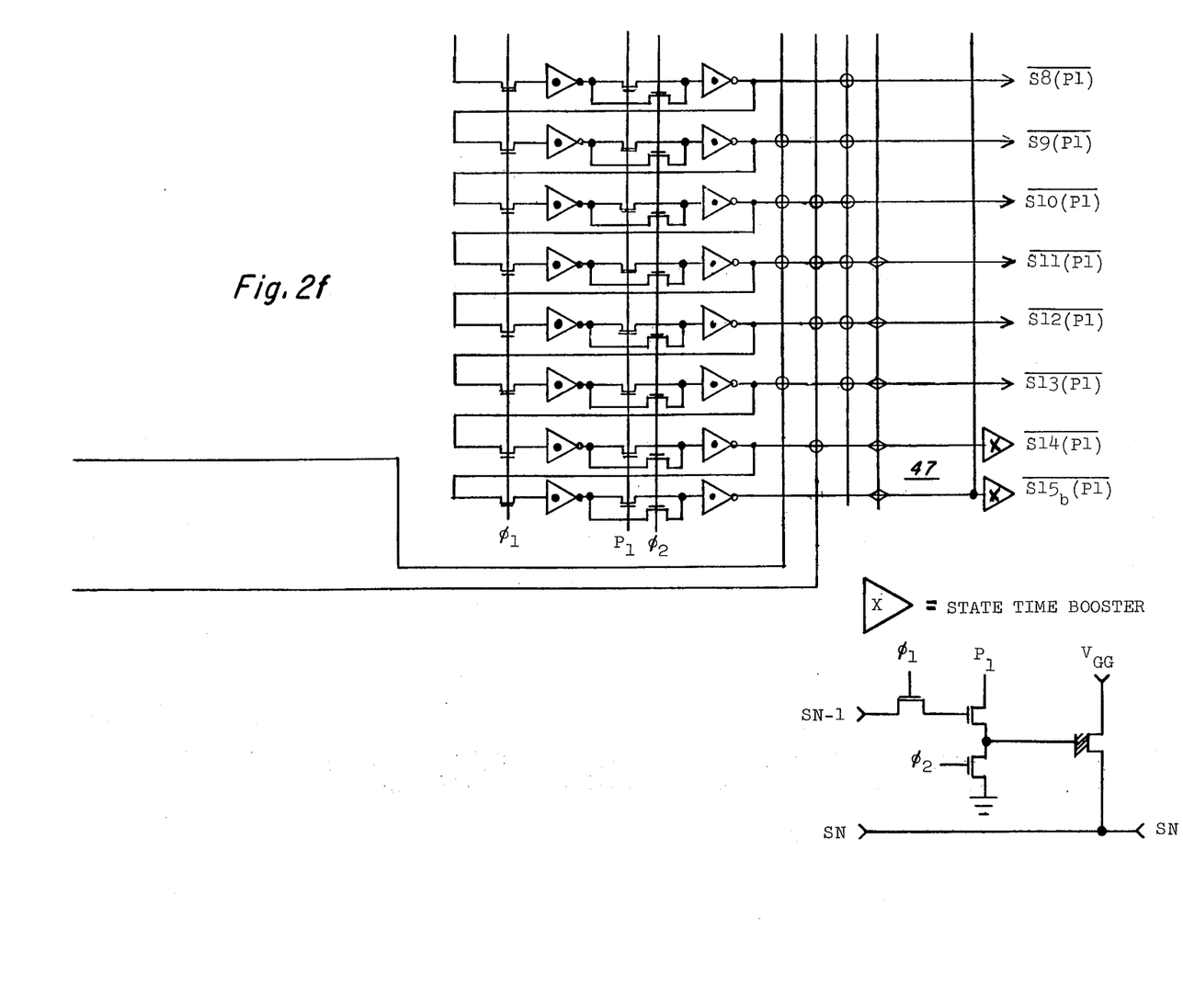

Referring to FIG. 1, there is there shown a functional block diagram of a memory system embodying the present invention. The memory system comprises an array 10 of transistor memory cells. Preferably, the array 10 is implemented as a sequentially addressed memory of the type disclosed in U.S. Pat. No. 3,893,088. Further, the memory system of this invention is preferably used in an Electronic Calculator or Microprocessor system. U.S. Pat. No. 3,924,110 discloses in detail a manner in which a SAM may be utilized with an electronic calculator. U.S. Pat. Nos. 3,893,088 and 3,924,110 are hereby incorporated herein by reference.

Array 10 is provided with a plurality of row conductors 11 and a plurality of column conductors 12 (FIG. 2). Individual row conductors 11 are identified as 11-0 through 11-15. The column conductors 12 are preferably arranged in groups which are identified with the subscript letters a-h; each group preferably includes sufficient column conductors 12 having associated cells for storing one decimal digit (i.e., four binary bits) of data. Preferably, each memory location 19, labeled $A_0$, $B_0$, $A_4$, $E_8$, etc., provides four binary bits of storage for storing one Binary Coded Decimal (BCD) or hexadecimal digit.

First commutator 13 successively strobes the row conductors 11, thereby permitting the recirculation and read out of data or insertion of new data via column conductors 12 into the particular row of memory cells then being strobed. In a preferred embodiment, commutator 13 strobes row conductors 11 in order; the row conductors 11, as a design choice, are strobed from a next to lowest conductor up to through the top conductor (11-0 through 11-15). The lower most conductor 11-15 and the top most conductor 11-15 are electrically connected in common and therefore strobed the same time. Clock/State Time Generator 15 preferably provides state time signals, $S_0$–$S_{15}$, to commutator 13 for successively strobing row conductors 11-0 through 11-15.

A second commutator 14a–14h interconnects the groups of column conductors 12a–12h with an input/output data bus 16. Data bus 16 preferably receives or supplies a four bit parallel BCD or hexadecimal digit of data during each state time while array 10 is being addressed. The groups of conductors 12a–12h are selectively coupled to the four parallel bits on bus 16 by the action of second commutator 14a–14h. Second commutator 14a–14h is preferably implemented as a multi-stage shift register responsive to a bit communicated on line 17 between the various stages thereof and further includes a plurality of gates 20 (FIG. 2) responsive to the shift register stages for selectively interconnecting input/output bus 16 with the groups of column conductors 12a–12h. The stages 14a–14h of the second commutator are preferably responsive to a logical zero being shifted on line 17. The logical zero shifts stages each state time, that is, preferably at the same frequency that the row conductors 11 are being strobed by commutator 13. Control logic 18 is responsive to a received address (from bus 16, for instance) for adjusting the phase relationship between the zero shifting between the stages 14a–14h of the second commutator and the strobing of the row conductors 11-0 through 11-15 by first commutator 13, so that a different selected one of the memory locations 19 is interconnected with bus 16 during each state time of a memory storage or recall operation.

Once the address dependent phase relationship is adjusted by control logic 18, the first commutator 13 successively strobes the row conductors 11 while the stages 14a–14h of the second commutator successively interconnect the groups of column conductors 12a–12h with data bus 16. Thus, a multidigit data word stored in array 10 occupies essentially a diagonal pattern of memory locations 19 in the array.

As will be seen with reference to FIG. 2, the group of four transistor memory cells comprising the memory location labeled $A_0$ are strobed by line 11-0 for storing data and are strobed by line 11-15 for outputting data therefrom. Similarly, the other memory locations 19 are also responsive to one adjacent row conductor for storing data and to another adjacent row conductor for outputting data. Thus, control logic 18 is also responsive to $\overline{STORE}$ and $\overline{RECALL}$ signals for further adjusting the aforementioned phase relationship based on whether the memory locations addressed are to be receiving or outputting data. For example, if a word of data is to be written into Register A, then commutator stage 14a is enabled at the same time row conductor 11-0 is strobed for entering the first digit thereof into the four transistor memory cells comprising memory location $A_0$ at state time $S_0$; at the next following state time, $S_1$, commutator stage 14b is enabled at the same time as row conductor 11-1 is strobed for storing the second digit. Commutator stages 14c–14h are then successively enabled as row conductors 11-2 through 11-7 are strobed for loading digits into the $A_2$–$A_7$ memory locations. Then another zero is outputted from control logic 18 on line 17 for again enabling commutator stages 14a at the same state time row conductor 11-8 is strobed for loading the next digit into the $A_8$ memory location. Commutator stages 14b–14h are successively enabled at the same state times as row conductors 11-9 through 11-15 are strobed for storing the remaining digits in memory locations $A_9$–$A_{15}$. As can be seen, during each state time, a four bit parallel digit of data is transferred between data bus 16 and array 10. The phase relationship between the state times at which the row conductors 11 are strobed and the state times at which commutator stages 14a–14h are enabled defines which register are to be read into or from data bus 16.

In the embodiment shown, it is contemplated that eight 16 digit data words are stored, with storage locations $A_0$–$A_{15}$ providing a register of storage for storing one of the eight data words. Registers B–H provide storage for seven more data words; the subscripts for the registers correspond to the particular row line 11-0 through 11-15 strobed to read in data.

The use of the second commutator, comprising stages 14a–14h, permits a single control line 17 to be used to indicate which one of the eight registers A–H of this embodiment is to be interconnected with input/output bus 16. Further, a second line 21 is used to indicate whether the memory locations addressed are to be receiving or outputting data when interconnected with the data bus 16. In the prior art, in lieu of using a shift register or commutator 14a–14h, the control logic would provide separate control signals for each set of register selector gates 20a–20h (FIG. 2) in lieu of using single control line 17 and line 21. It has been discovered that the use of this shift register technique, combined with the reduction of the number of control lines, results in a net reduction of the total silicon area required to implement the memory system, such as the sequentially addressed memory system disclosed, compared to memory systems used in the prior art.

Referring now to FIG. 2, there is shown a detailed logic diagram of a memory system incorporating the present invention. The following discussion will refer to the logic signals available at many points in the memory system. It should be remembered that a logical zero corresponds to a negative voltage, that is, $V_{DD}$ while a logical one refers to a zero voltage, that is $V_{SS}$. It should further be remembered that the P-channel MOS transistors depicted in FIG. 2 become conductive when a logical zero, i.e., a negative voltage, is supplied at the respective gates. When a logical signal is referred to which is unbarred, i.e., has no bar across the top of it, the logic signal is to be interpreted as "true logic"; that is, a binary one indicates the presence of the signal ($V_{SS}$) whereas the binary zero indicates a lack of the signal ($V_{DD}$). Logic signal names including a bar across the top thereof are in "false" logic; that is, a binary zero ($V_{DD}$ voltage) indicates the presence of the signal whereas a binary one ($V_{SS}$ voltage) indicates that the signal is not present. FIG. 2 does not depict the clock generator used in driving the memory system; however, the clock generator may be of conventional design for providing four clock phases $\phi_1$, $P_1$, $\phi_2$ and $P_2$.

In FIG. 2, only a portion 10a of array 10 is depicted; however, this portion, comprising that which is bounded by the reference A dotted line, is structurally the same as the other portions of array 10 depicted in FIG. 1. It is to be understood that portion 10a of array 10, including commutator section 14a and other elements enclosed by the reference A line, repeat seven additional times in embodying the memory system depicted in FIG. 1. Inasmuch as these additional sections are schematically identical to the portion depicted, except for the labeling of the memory locations and the subscripting of the various numerals, these portions are not depicted here for sake of clarity. Considering now briefly the $A_0$ memory locations, it can be seen that it comprises four memory cells, each of which has three transistors arranged as a conventional random access memory cell for storing one bit of digital information. Data is read into a cell on column conductors 12a-1, 12a-2, 12a-4 or 12a-8 (input column conductors). Here the additional number (1, 2, 4 or 8) subscript is used to differentiate between the column conductors disposed in a group. Data is read out of a cell on column conductors 12a-1', 12a-2', 12a-4', or 12a-8' (output column conductors). Except when reading in data from data bus 16, the data is recirculated via gates 46 and 20a from the output conductors back to the input conductors. When reading in data from data bus 16, the data is inputted into the input column conductors via gates 22-1 through 22-8. Taking memory location $A_0$, for instance, when row conductor 11-15 is strobed, data is read out of the $A_0$ memory location on the output conductor and then when row conductor 11-0 is strobed, that data is reread into the $A_0$ memory location (during the recirculation or the outputting of data) or data from data bus 16 is read to the $A_0$ memory location input conductors during the same state time that data is being read out of the $H_1$ location on the output conductors.

The logical zero traveling on line 17 for enabling the stages of the second commutator 14a–14h is stored for one state time in a stage 23a–23h of a shift register, the stage comprising two inverters, disposed in each one of the commutator stages 14a–14h. The output of each stage 23a–23h is supplied to the register selector gates 20a–20h for interconnecting data to column conductors 12a–12h when the logical zero is outputted therefrom to gates 22-1 through 22-8. NOR gate 24 outputs a recirculation signal, $\overline{REC}$, which is normally a logical zero and changes to a logical one only upon the occurrence of a $\overline{STORE\ 2}$ signal on line 21 and a logical zero from stage 23, indicating that a storage operation is indicated and the particular memory location available has been addressed by control logic 18 according to the signal on line 17. The $\overline{REC}$ signal from NOR gate 24 is inverted to a $\overline{STORE\ 3}$ signal by inverter 25. The register selector gates 20a–20h each comprise four complex gates, each of which includes a pair of OR gates, one of which is responsive to a selected bit from data bus 16, $\overline{STORE\ 3}$, and a clock. The other OR gate is responsive to a $\phi_2$ clock, $\overline{REC}$, and a selected output column conductor via a gate 46. The output of the two OR gates is coupled to a NAND gate whose output is coupled to the respective input column conductors. When data is to be read out of the memory cells, it is both recirculated via gates 46 and read out on to data bus 16 via gates 26 and 22-1 through 22-8.

Data bus 16 may be interconnected with input/output pins I/01 through I/08, which may be utilized, for instance, if the semiconductor memory system is implemented on a semiconductor chip. The embodiment disclosed is intended for use on a semiconductor chip and thus data bus 16 is interconnected with pins I/01 through I/08 via lines 26-1 through 26-8 and gates 27 for receiving data from off chip and via buffers 28, lines 29-1 through 29-8 and gates 30 for outputting data from the memory system off chip. Gates 30 are responsive to a received $\overline{RECALL}$ signal at gate 34 via gates 46. Further, gates 34 and 46 control gates 49 and 50 which permit the outputs of buffers 28 to float except during the outputting of data from the chip.

As aforementioned, the memory system is preferably responsive to $\overline{STORE}$ and $\overline{RECALL}$ signals for indicating whether the memory system is to output or receive data. If data is to be received and stored, the logical zero from $\overline{STORE}$ is supplied via pair of inverters 31 to control line 21 and further via a pair of inverters 32 to gates 27. Further, the $\overline{STORE}$ and $\overline{RECALL}$ commands are preferably generated approximately sixteen state times (eg. one instruction cycle) before data is to be received or outputted to permit decoding of an address on lines 26-1 through 26-8 indicating which one of the registers A–H is to receive or output the data. Thus, the $\overline{STORE\ 2}$ signal at control line 21 is delayed by approximately sixteen state times by the action of gates 32. The address received on lines 26-1 through 26-8 is coupled via gates 38 into a four bit latch 33, the output of which is supplied to an exclusive NOR gate 51. The received address, in the embodiment disclosed, is stored in latch 33 because the logical zero generated on line 17 is repeatively generated during inputting or outputting a complete sixteen bit data word. The address is coupled into latch 33 by the action of gates 38, 40, 39 and 48 during the $S_1$ state time preceding the transferring of data.

Exclusive NOR gate 51 is also responsive to an address received serially on line 35 and converted to parallel false and true logic inputs to exclusive NOR gate 51 by a series of inverters 36. The addresses appearing on line 35 are pseudorandom addresses generated by a decoder 47. Decoder 47 is coupled to a state time generator of the type described with reference to FIG. 9c in the aforementioned U.S. Pat. No. 3,924,110, for instance. The addresses provided by decoder 47 are pseudorandom because this permits the structure decoder 47 to be simplified compared to a decoder for providing sequentially generated addresses; however, a sequentially generated address could similarly be used. Inasmuch as the addresses on line 35, in the embodiment disclosed, are pseudorandom, registers A–H correspond to the addresses listed in Table I. The three bit addresses listed in Table I define the eight registers A–H and these addresses are received on lines 26-1 through 26-4. The state received as an address on line 26-8 may be used as a chip select signal, in a multiple chip system, according to how the output of the most significant bit storage of latch 33 is interconnected with exclusive NOR gate 51 according to programmable gates 37. The serial address occurring on line 35 is supplied from decoder 47 via gate 41 during memory recall operations or via gate 42 during memory storage operations. The address appearing from decoder 47 to gate 41 and 42 is the same address except that it is delayed by one state time at gate 42 compared to gate 41. The addresses supplied to line 35 differ by a state time according to whether a recall or storage operation is indicated because, for a given memory location 19, there is a one state time difference according to whether the memory cells thereof are inputting or outputting data. It should be remembered that this one state time difference derives from the fact each memory location is strobed by different adjacent row conductors 11 according to whether the cells thereof are inputting or outputting data, as aforementioned. Thus, upon detecting a $\overline{STORE}$ signal, the addresses from decoder 47 are clocked on a delayed count via gate 42. Gates 43 detect the $\overline{STORE}$ for controlling gate 41 directly and gate 42 via an inverter 44. The pseudorandom addresses on line 35 repeat every eight state times, so that the output of exclusive NOR gate 51 goes to a logical zero three or four times during the twenty-nine (for storing data) to thirty-one (for recalling data) state times used for (1) decoding an address, (2) loading a logical zero on line 17 and (3) strobing the row conductors 11 of array 10. Of course, the output of exclusive NOR gate 51 becomes a logical zero upon detecting a match between the pseudorandom address received on line 35 via gates 36 and the address stored in latch 33.

Gates 45 are arranged to enable exclusive NOR gate 51 only if a $\overline{STORE}$ or $\overline{RECALL}$ signal has been received and only for the aforementioned twenty-nine to thirty-one state times. Referring briefly to FIG. 1, if data is to be read from Register H, the zero bit on line 17 should be outputted from exclusive NOR gate 51 at $S_8$, so that it can shift to commutator stage 14h by the time row conductor 11-15 is being strobed at the following $S_{15}$ state time. No data is read into or from the memory while the zero bit is shifting to stage 14h (during $S_8$-$S_{14}$) because line 21 is still at a logical one, so all registers are recirculating, and the output of bus 16 is isolated because gates 27 and 30 are not conducting. Gates 30 interconnect the addressed register with output buffer 28 beginning at state time $S_{15}$ by the action of gates 34 and 46.

Since the aforementioned memory operation demonstrates the earliest time for loading the logical zero on line 17, exclusive NOR gate 51 need only be enabled from the $S_8$ state time immediately preceding the sixteen state times required for transferring data to approximately the end of those sixteen state times. In this embodiment, however, exclusive NOR gate 51 is enabled from $S_0$ (for recalling data) or $S_3$ (for storing data) of the preceding instruction cycle, but again no memory operations occur because of the logical one then on line 21 and the action of gates 27 and 30.

Having described the invention in connection with a specific embodiment thereof, further modification may now suggest itself to those skilled in the art. For instance, the number of columns and rows of cells in the array as well as the number of registers and number of digits per register may be varied, as desired. It is to be understood that this invention is not limited to the specific embodiment disclosed, except as set forth in the appended claims.

TABLE I

| REGISTER | ADDRESS |
|---|---|
| A | 011 |
| B | 111 |
| C | 110 |
| D | 101 |
| E | 010 |
| F | 100 |
| G | 000 |
| H | 001 |

What is claimed is:

1. A data storage system comprising:
  (a) an array of memory cells arranged in rows and columns, the cells of each column having a common input/output conductor;
  (b) first commutator means for successively strobing row conductors of said array for enabling the rows of cells associated with said row conductors to receive and to output data on said common input/output conductors;
  (c) a bus for transmitting digital data to and from said array; and
  (d) second commutator means for selectively interconnecting said columns of memory cells with said bus.

2. The system according to claim 1, wherein said columns of memory cells are arranged in groups and wherein said second commutator means successively interconnects said groups with said bus.

3. The system according to claim 2 further including control means for adjusting the phase relationship between the strobing of said row conductors and the interconnecting of said groups according to an address received by said control means.

4. The system according to claim 2, wherein said memory cells comprise random access transistor memory cells and wherein said second commutator means comprises:
  (a) a shift register having a stage thereof associated with each one of said groups; and
  (b) a plurality of register selector gates coupled to said shift register for interconnecting said groups with said bus depending on the state of said shift register.

5. The system according to claim 4, further including control means, responsive to an address received by said system for loading said shift register with binary signals.

6. The system according to claim 1, wherein said second commutator means comprises:
  (a) a shift register having a plurality of stages, at least one of said columns of memory cells being associated with each of said stages; and
  (b) a plurality of register selector gates coupled to said shift register for interconnecting said columns of memory cells with said bus according to the state of said shift register.

7. The system according to claim 6, further comprising control means, responsive to an address received by said system for loading said shift register with binary signals, said binary signals when being of a predetermined binary state are effective for permitting the transferring of data between said array and said bus.

8. A data storage system comprising:
  (a) an array of memory cells arranged in rows and columns;
  (b) first commutator means for successively strobing the rows of cells to permit the row of cells strobed to store data supplied thereto;
  (c) a bus for transferring data to said array; and
  (d) second commutator means for successively coupling the memory cells arranged in said columns to said bus.

9. The system according to claim 8, further including control means for adjusting the phase relationship between the strobing of the rows of cells by said first commutator means and the coupling the columns of cells by said second commutator means according to an address received by said control means.

10. The data storage system according to claim 9, wherein said second commutator means comprises:
  (a) a shift register having a plurality of stages, at least one of said columns of memory cells being associated with each of said stages; and
  (b) a plurality of register selector gates coupled to said shift register for interconnecting said columns of memory cells with said bus according to the state of said shift register.

11. The system according to claim 10, wherein said control means loads said shift register with binary signals, said binary signals being of particular binary states depending upon the address received by said control means.

12. The system according to claim 9, wherein said control means is coupled to said bus and wherein said address is communicated on said bus to said control means.

13. The system according to claim 8, wherein said columns of memory cells are arranged in groups for storing bits of data received on said bus in parallel and wherein said second second commutator means successively interconnects said groups with said bus.

14. A data memory for storing a plurality of words of data received from a bus, said data memory comprising:

(a) an array of memory cells arranged in rows and columns, said rows being responsive to a strobe signal for storing data supplied thereto;

(b) first means for generating said strobe signal;

(c) second means for successively coupling the memory cells arranged in said column to said bus in response to a control signal; and (d) control means for generating said control signal, said control means being responsive to an address received thereby and to said first means for adjusting the timing of said control signal with respect to the strobe signal.

15. The data memory according to claim 14, wherein said control means is coupled to said bus and wherein said address is communicated on said bus to said control means.

16. The system according to claim 14, wherein said second means comprises:

(a) a shift register having a plurality of stages, at least one of said columns of memory cells being associated with each of said stages; and (b) a plurality of register selector gates coupled to said shift register for interconnecting said columns of memory cells with said bus according to the state of said shift register.

17. The system according to claim 16, wherein said control means loads said shift register with binary signals, said binary signals being of particular binary states depending upon the address received by said control means.

18. A data storage system comprising:

(a) an array of memory cells arranged in rows and columns, the cells of a column having input and output conductors common to all cells in a column;

(b) first commutator means for successively strobing row conductors of said array for enabling the rows of cells associated with said row conductors to receive and to output data on said input and output conductors;

(c) a bus for transmitting digital data to and from said array;

(d) second commutator means for interconnecting said columns of memory cells with said bus; and (e) control means for controlling the strobing of said row conductors at the same rate as a bit shifting between the stages of said shift register and for controlling the phase relationship between the strobing of said row conductors and the shifting of said bit in said shift register according to an address received by said system whereby trains of digital data received on said bus are stored in diagonal patterns in said array.

19. A data storage system comprising:

(a) an array of memory cells arranged in rows and columns;

(b) first commutator means for successively strobing the rows of cells to permit the row of cells strobed to store data supplied thereto;

(c) a bus for transferring data to said array; and (d) second commutator means for successively coupling the memory cells arranged in said columns to said bus, said first commutator means strobing said rows of cells at the same rate as said second commutator means couples said columns to said bus.

20. The system according to claim 19 wherein said columns of memory cells are arranged in groups for storing bits of data received on said bus in parallel and wherein said commutator means successively interconnects said groups with said bus.

21. A data memory for storing a plurality of words of data received from a bus, said data memory comprising:

(a) an array of memory cells arranged in rows and columns, said rows being responsive to a strobe signal for storing data supplied thereto;

(b) first means for generating said strobe signal;

(c) second means for successively coupling the memory cells arranged in said column to said bus in response to a control signal; and (d) control means for generating said control signal, said control means being responsive to an address received thereby and to said first means for adjusting the timing of said control signal with respect to the strobe signal, said first commutator means strobing said rows of cells at the same rate as said second commutator means couples said columns to said bus.

22. The system according to claim 21 wherein said columns of memory cells are arranged in groups for storing bits of data on said bus in parallel and wherein said second means successively interconnects said groups with said bus.

* * * * *